(12) United States Patent
Hattori

(10) Patent No.: US 6,281,727 B1
(45) Date of Patent: Aug. 28, 2001

(54) FINE-TUNING PHASE-LOCKED LOOP PLL USING VARIABLE RESISTOR BETWEEN DUAL PLL LOOPS

(75) Inventor: Hide Hattori, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/679,684

(22) Filed: Oct. 5, 2000

(51) Int. Cl.[7] ........................ H03L 7/06
(52) U.S. Cl. ........................ 327/156; 375/376
(58) Field of Search ........................ 327/146, 147, 327/148, 150, 155, 156, 157, 159; 375/373–376; 331/17

(56) References Cited

U.S. PATENT DOCUMENTS

| | | | |
|---|---|---|---|
| 4,929,918 | 5/1990 | Chung et al. | 331/10 |
| 5,075,639 | 12/1991 | Taya | 331/2 |
| 5,317,284 | 5/1994 | Yang | 331/2 |
| 5,329,250 | 7/1994 | Imaizumi et al. | 331/2 |
| 5,414,390 | 5/1995 | Kovacs et al. | 331/2 |
| 5,418,497 | 5/1995 | Martin | 331/48 |
| 5,422,604 * | 6/1995 | Jokura | 331/2 |
| 5,534,822 | 7/1996 | Taniguchi et al. | 331/2 |
| 5,570,395 * | 10/1996 | Myers | 375/346 |
| 5,610,558 | 3/1997 | Mittel et al. | 331/2 |
| 5,646,562 * | 7/1997 | Abe | 327/156 |
| 5,748,044 | 5/1998 | Xue | 331/2 |
| 5,943,382 | 8/1999 | Li et al. | 375/376 |
| 5,950,115 * | 9/1999 | Momtaz et al. | 455/73 |
| 5,977,806 * | 11/1999 | Kikuchi | 327/157 |
| 6,118,316 * | 9/2000 | Tamamura et al. | 327/156 |
| 6,188,258 * | 2/2001 | Nakatani | 327/157 |

* cited by examiner

Primary Examiner—My-Trang Nu Ton
(74) Attorney, Agent, or Firm—Stuart T. Auvinen (57) ABSTRACT

A clock generator uses two PLL loops and a variable resistor to generate a variable output frequency from a single fixed-frequency reference clock. Each PLL loop receives the reference clock and phase-compares it with a feedback clock. The feedback clock in one loop is slightly faster in frequency than the feedback clock in the second loop. The input voltages to voltage-controlled oscillators (VCOs) in the two loops thus vary slightly. A variable resistor is connected between the two inputs to the VCOs. The variable resistor has a center tap that can be selected from locations along the variable resistor. The center tap voltage is input to a final VCO that generates the variable output frequency. The output frequency is varied by selecting the center tap's location along the variable resistor. The variable resistor can be constructed from a series of sub-resistors with the center-tap location chosen by select transistors acting as a multiplexer.

20 Claims, 5 Drawing Sheets

FINE-TUNING PHASE-LOCKED LOOP PLL USING VARIABLE RESISTOR BETWEEN DUAL PLL LOOPS

FIELD OF THE INVENTION

This invention relates to Phase-locked loops (PLL's), and more particularly to finely-tuned dual PLL's.

BACKGROUND OF THE INVENTION

Digital systems often rely on accurate clocks to synchronize the timing of operations and data transfers. A crystal oscillator is often used to generate a clock at a base frequency, which is then divided or multiplied to create one or more clocks with desired frequencies. External clock can be received and likewise divided or multiplied to produce internal clocks.

Clocks are typically generated from oscillator outputs using phase-locked loops (PLL's). PLLs are one of the most widely use building blocks in digital systems today. See for example, U.S. Pat. No. 6,124,741 by Arcus, and assigned to Pericom Semiconductor Corp. of San Jose, Calif.

Figure 1:
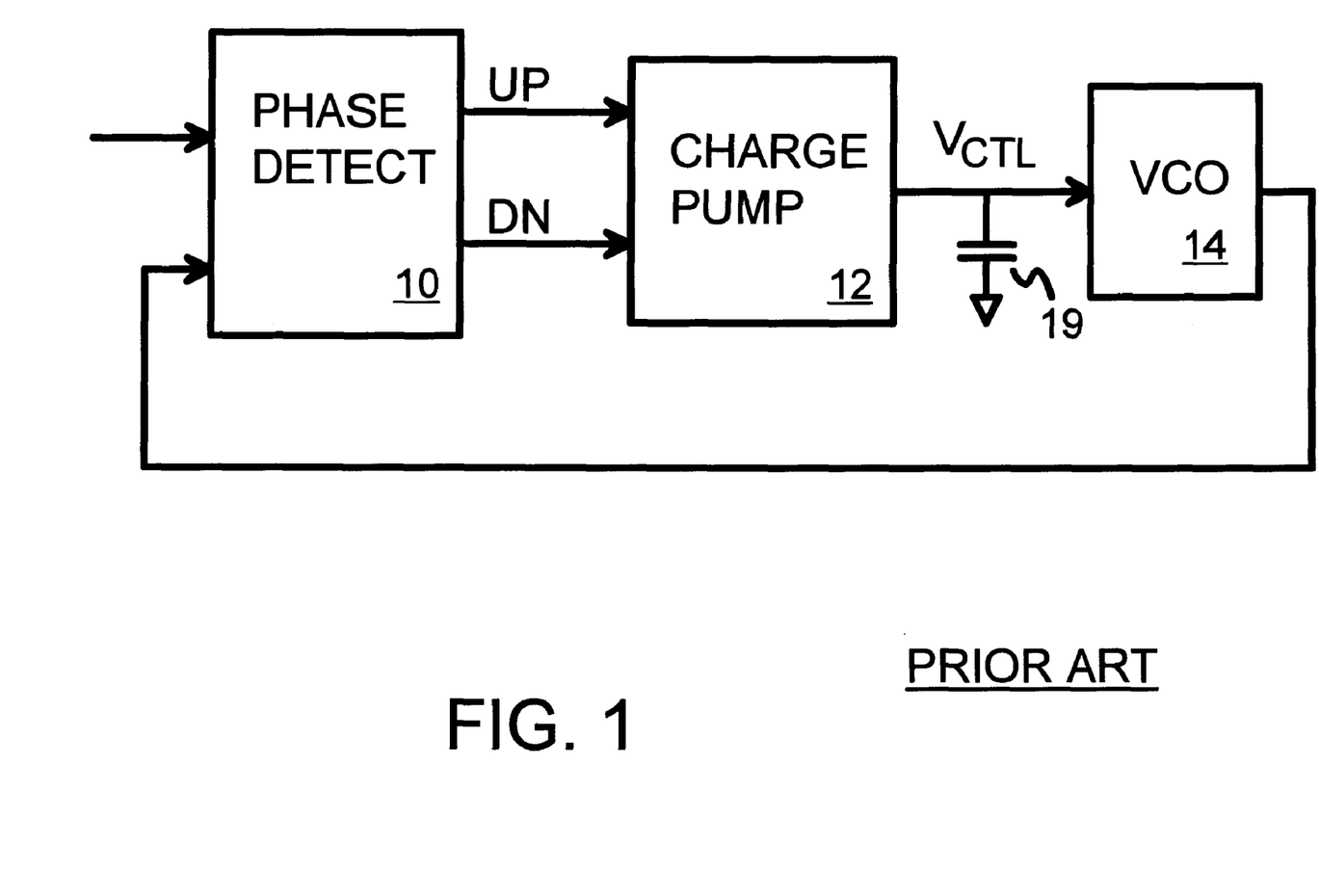
FIG. 1 illustrates a typical PLL.

FIG. 1 illustrates a typical PLL. Phase detector 10 receives a reference-clock input from an external oscillator or clock source. The phase and frequency of the reference clock is compared to the phase and frequency of a feedback clock generated by voltage-controlled oscillator (VCO) 14. The feedback clock can be the output clock generated by the PLL, or a divided-down derivative of the output clock from VCO 14. Phase detector 10 outputs up and down signals UP, DN when the phase or frequency of one input does not match the phase or frequency of the other input. These up and down signals cause charge pump 12 to add or remove charge from filter capacitor 19, which integrates the charge. As charge is added or removed from filter capacitor 19, the voltage input to VCO 14 is increased or decreased. VCO 14 responds by increasing or decreasing the frequency of the output clock. The feedback clock to phase detector 10 is likewise changed by VCO 14.

As charge pump 12 adds or removes charge from filter capacitor 19, altering control voltage $V_{CTL}$ input to VCO 14, the phase and frequency of the feedback clock are adjusted until the reference clock is matched. Then phase detector 10 stops generating up and down signals to charge pump 12, until charge leaks off filter capacitor 19 or the reference clock changes.

Often the reference or input frequency is not exactly the same as the desired output frequency. The reference frequency may be divided or multiplied to obtain the output frequency, but the desired output frequency may still not be a multiple or divisor of the reference frequency. For example, the desired frequency may be an abstract frequency completely unrelated to the reference frequency. In the past, the system designer chose the reference frequency to be an exact multiple or divisor of the desired frequency.

Various PLL's with multiple loops have been developed. See U.S. Pat. Nos. 5,943,382 by Li et al., 5,393,250 by Imaizumi et al., 5,075,639 by Taya, and 5,317,284 by Yang. While useful, a dual-loop PLL that outputs a clock with a finely-adjustable frequency is desired.

In some applications, it is desired to finely-tune the output frequency. It is useful to finely tune the output frequency without requiring any change to the reference frequency. Adjustment of the output frequency is desirable. A PLL that uses a fixed reference frequency input, but that can generate a range of finely-tuned output frequencies, is desirable.

DETAILED DESCRIPTION

The present invention relates to an improvement in finely-tuned PLL's. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that a finely-tuned clock can be generated from two PLL loops with slightly different frequencies. The frequency of each loop depends on a voltage input to the loop's voltage-controlled oscillator (VCO). The VCO voltage input for the two loops with slightly different output frequencies differ in voltage from each other.

The inventor realizes that a resistor can be coupled between the two loops. The resistor is coupled between the two loop's VCO inputs. The resistor is a variable resistor with a center tap that is "movable" or adjustable. The location of the center tap can be selected from points along the length of the resistor. The voltage at the center tap is fed to a third VCO that generates the finely-tuned output clock.

The voltage of the center tap is a voltage between the two loop's VCO voltages, and thus generates a frequency that is between the frequency of the two loops. The inventor realizes exact location of the center tap can be adjusted to get the voltage that produces the exact frequency desired.

Figure 2:
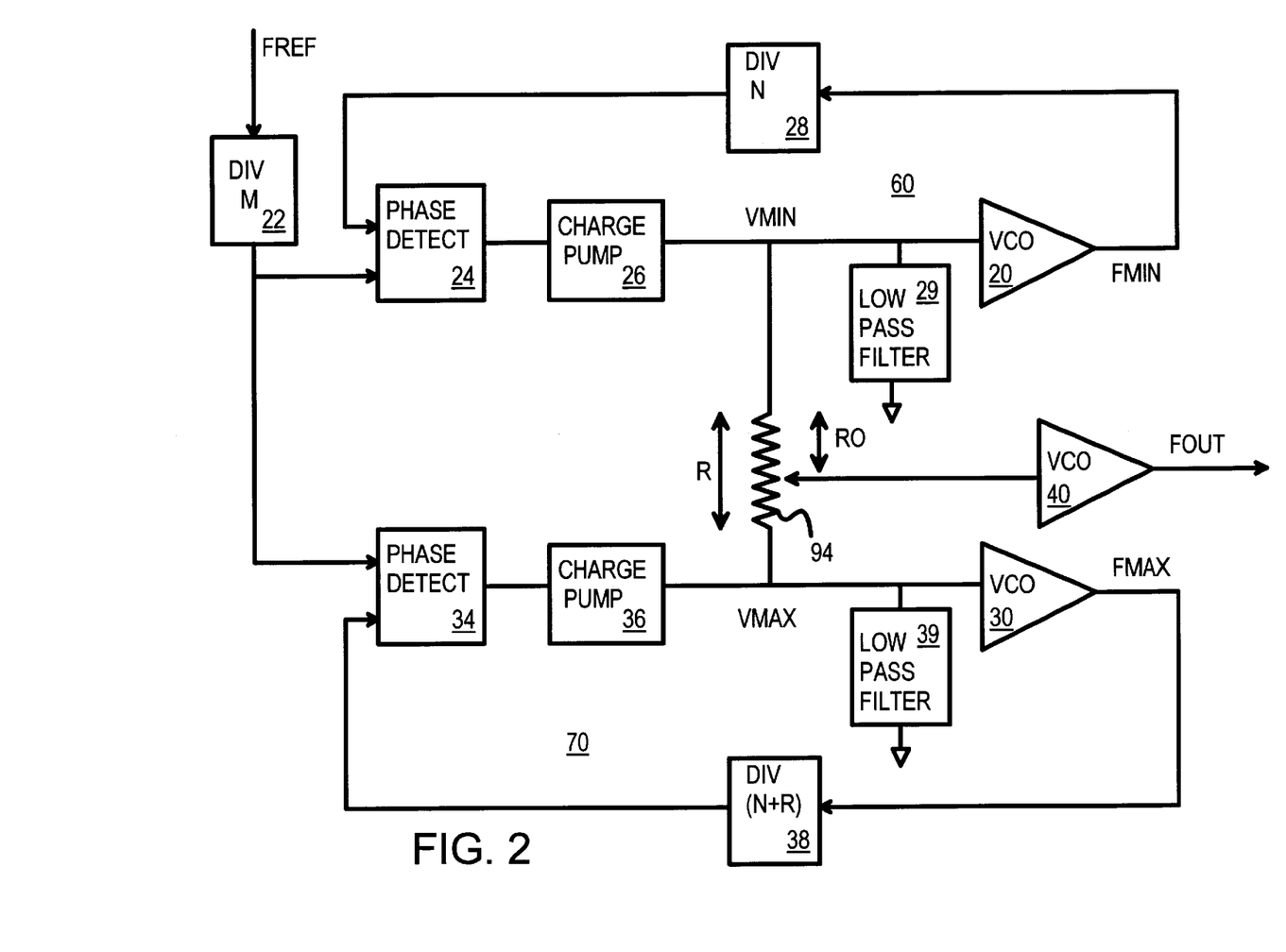
FIG. 2 is a diagram of a dual-PLL clock generator with a variable resistor generating a final VCO voltage.

FIG. 2 is a diagram of a dual-PLL clock generator with a variable resistor generating a final VCO voltage. A reference clock FREF having a fixed reference frequency is input to input divider 22. Input divider 22 is optional, but allows the reference frequency to be divided by M. The divided clock of frequency FREF/M is applied to phase detectors 24, 34 of loops 60, 70.

Phase detector 24 in PLL loop 60 compares the divided reference clock with a loop feedback clock from divider 28. The phase difference detected activates charge pump 26, which charges or discharges capacitance in low-pass filter 29. When a phase difference is detected by phase detector 24, charge pump 26 charges or discharges low-pass filter 29, which increases or decreases the voltage VMIN input to VCO 20. A higher or lower VMIN voltage input to VCO 20 causes the frequency FMIN output by VCO 20 to increase or decrease slightly. The clock from VCO 20 is then divided by N by divider 28 and input to phase detector 24.

For PLL loop 70, phase detector 34 also receives the divided reference clock and compares it with a loop feedback clock from divider 38. The phase difference detected activates charge pump 36, which charges or discharges capacitance in low-pass filter 39. When a phase difference is detected by phase detector 34, charge pump 36 charges or discharges low-pass filter 39, which increases or decreases the VMAX voltage input to VCO 30. A higher or lower VMAX voltage input to VCO 30 causes the frequency FMAX output by VCO 30 to increase or decrease slightly. The clock from VCO 30 is then divided by N+R by divider 38 and input to phase detector 34.

The two PLL loops 60, 70 operate in the same way, except that divider 28 divides by N while divider 38 divided by (N+R). Normally R is much smaller than N, so that N+R is slightly larger than N. Dividers 28, 38 effectively multiply the reference clock frequency since they are in the feedback loop. The larger feedback divisor in loop 70 reduces the frequency of the clock input to phase detector 34. To compensate, loop 70 slightly increases the VCO input voltage VMAX, slightly increasing the clock frequency FMAX from VCO 30. This locks loop 70 to a slightly higher frequency than loop 60.

The frequency output by VCO 20 in first loop 60 is FMIN=FREF*N/M, while the frequency output by VCO 30 in second loop 70 is FMAX=FREF*(N+R)/M. FMAX is slightly larger than FMIN. M, N, and R are whole numbers.

Loops 60, 70 are connected together by variable resistor 94. The fixed terminals of variable resistor 94 are connected to the VCO input voltages VMIN from loop 60 and VMAX from loop 70. The overall resistance R of variable resistor 94 is large so that current flowing through variable resistor 94 from VMAX to VMIN is small and does not significantly change low-pass filter 29.

The current flowing through resistor 94 should be small enough so that the voltage changes due to this current on top of the capacitor's leakage current is small enough for charge pumps 26, 36 to compensate. In that case the resistance of resistor 94 should be at least $$> \frac{M*20}{Fref*C} M/Fref*20/C.$$

Other techniques can also be used to avoid this problem.

The center tap of variable resistor 94 is selectable from among many points along its length. The center tap of variable resistor 94 is coupled to the input of final VCO 40. Final VCO 40 converts the voltage at the center tap to a frequency FOUT of the output clock. Since the center-tap voltage is somewhere between VMAX and VMIN, the frequency output FOUT is between FMAX and FMIN.

The exact frequency generated depends on RO, which is the fraction of the total resistance R of variable resistor 94 to the center tap's position. The output frequency produced is FOUT=FMIN+(FMAX−FMIN)*RO/R. When the center tap is moved all the way to the upper end of variable resistor 94, the voltage VMIN from first loop 60 is selected, and FOUT=FMIN. When the center tap is moved all the way to the lower end of variable resistor 94, the voltage VMAX from second loop 70 is selected, and FOUT=FMAX. Otherwise, the output frequency produced is a function of the center-tap location, RO/R.

Figure 3:
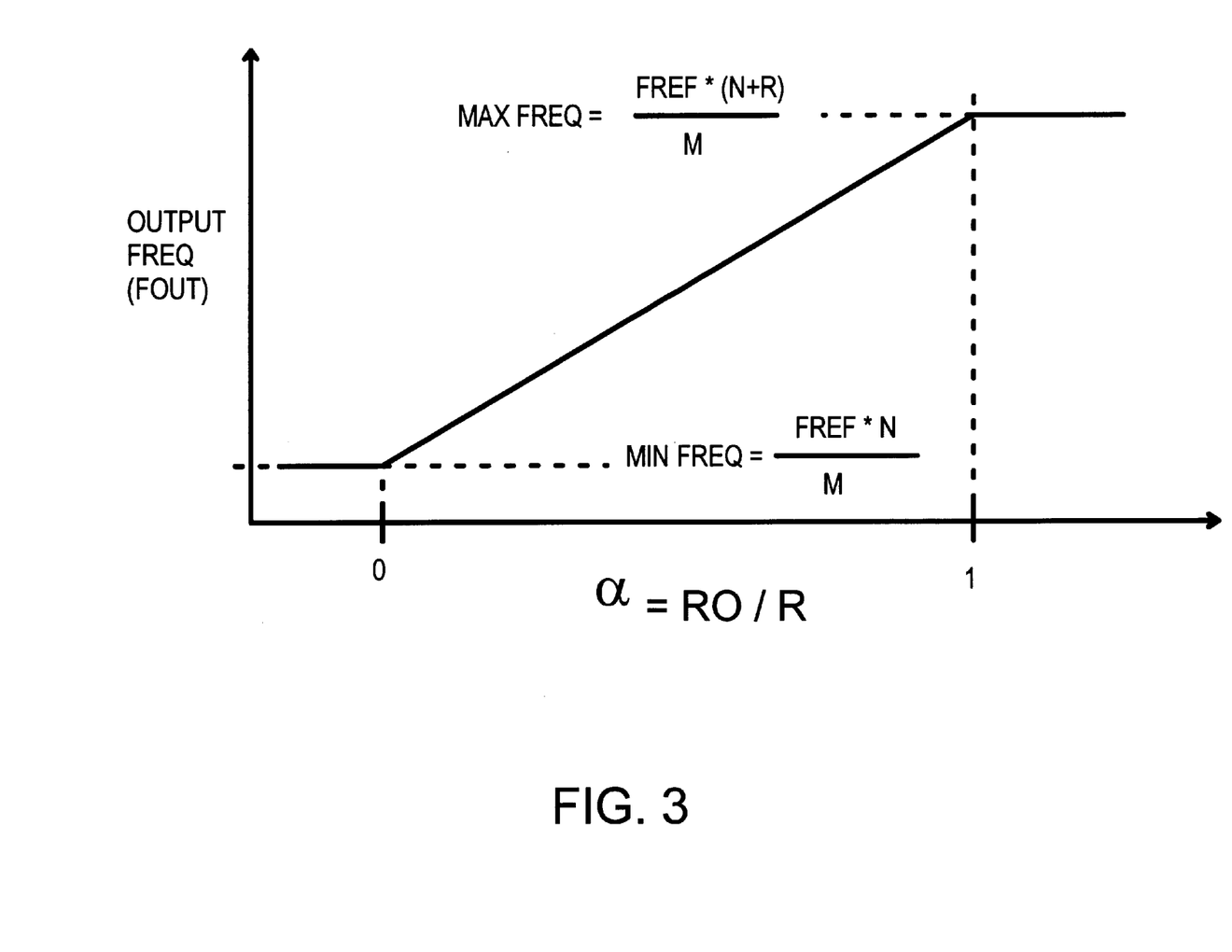
FIG. 3 is a graph showing how output frequency varies with the location of the center tap along the variable resistor.

Frequency Varies with Center-Tap Location—FIG. 3

FIG. 3 is a graph showing how output frequency varies with the location of the center tap along the variable resistor. The output frequency FOUT is shown along the y-axis, while alpha, the location of the center tap relative to the total resistance of the variable resistor, is shown on the x-axis. Alpha can be expressed as RO/R, where RO is the output resistance to the center tap, while R is the total resistance from the first PLL loop to the second PLL loop. RO is selected by the location of the center tap.

The output frequency is a linear function of alpha. FOUT is the minimum frequency of the first PLL loop, FMIN or FREF*N/M, for alpha=0, which occurs when RO is zero, and the center tap is taken from the VCO input voltage of the first PLL loop. FOUT is the maximum frequency of the second PLL loop, FMAX or FREF*(N+R)/M, for alpha=1, which occurs when RO is equal to R, and the center tap is taken from the VCO input voltage of the second PLL loop.

Any desired output frequency can be obtained between FMIN and FMAX by selecting the center tap position to an appropriate location between the terminals of the variable resistor. For example, an output frequency of (FMAX+FMIN)/2 is obtained by selecting the center tap from the middle of the variable resistor, where RO=R/2. Other output frequency values can be obtained by selecting the center-tap location at the appropriate fraction of the total resistor length.

While fully-continuous selection of the center-tap location was possible with older discrete variable resistors, integrated circuits often require that the possible selections of center-tap locations be quantized. For example, the center tap location can be selected from any one of 64 locations using an 6-bit digital code. The variable resistor is then constructed from 63 equal-value sub-resistors. The center tap is selected from one of the 62 nodes between 2 of the sub-resistors, or one of the 2 terminals, the VCO input voltages for the first and second PLL loops.

Figure 4:
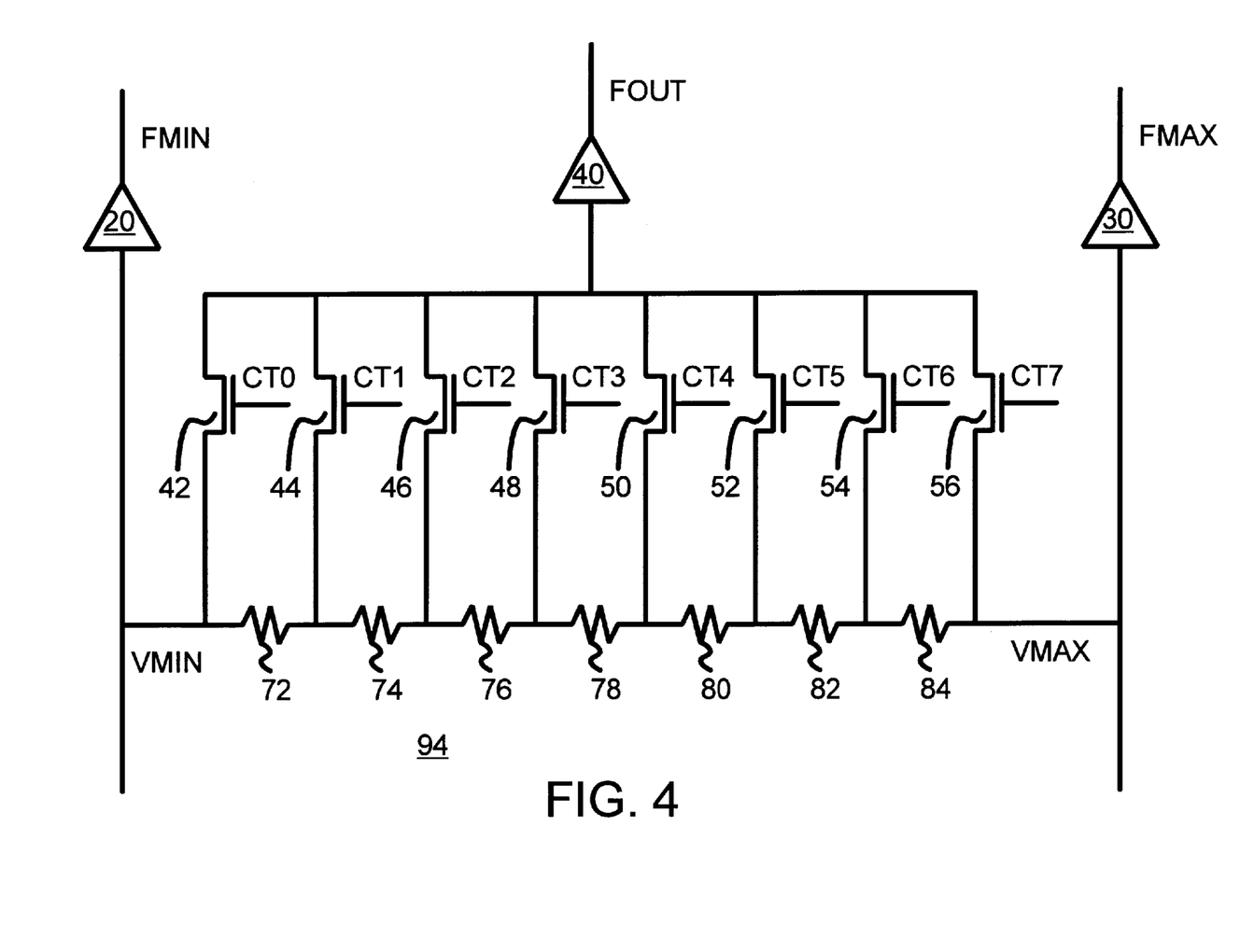
FIG. 4 is a diagram of a variable resistor with a center tap that is selected using transistors.

Integrated Variable Resistor—FIG. 4

FIG. 4 is a diagram of a variable resistor with a center tap that is selected using transistors. Such a variable resistor can be easily integrated with other PLL components on a single silicon substrate.

Variable resistor 94 is constructed from a series of fixed-size sub-resistors 72, 74, 76, 78 . . . 84. Each of the seven sub-resistor 72, 74 . . . 84 has a resistance of one-seventh the total resistance R of variable resistor 94. The output resistance RO can be selected to be a value of 0, R/7, 2R/7, 3R/7, . . . 6R/7, or R by enabling one of select transistors 42, 44, 46, . . . 56.

A multiplexer function is implemented by select transistors 42, 44, 56. One of the select signals CT0:7 is driven high while the other 7 are driven low. This causes only one of select transistors 42, 44, . . . 56 to be turned on while the others are turned off. Thus only one of the nodes along variable resistor 94 is selected as the center tap whose voltage is applied to the input of final VCO 40. This selected voltage determines the output voltage FOUT.

For example, when CT0 is high, select transistor 42 is turned on and the other select transistors 44, 46 . . . 56 turned off. This couples VMIN input to VCO 20 in loop 60 to be input to final VCO 40, which generates FMIN as FOUT. When CT7 is high, select transistor 56 is turned on and the other select transistors 42, 44, 46 . . . 54 turned off. This couples VMAX input to VCO 30 in loop 70 to be input to final VCO 40, which generates FMAX as FOUT.

When CT1 is high, select transistor 44 is turned on and the other select transistors 42, 46 . . . 56 turned off. This couples the node voltage between sub-resistors 72, 74 to be input to final VCO 40, which generates an intermediate frequency of FMIN+(FMAX−FMIN)/7 as FOUT.

A decoder (not shown) can be used with a 3-bit decoded input to generate a one-hot decoding of select signal CT0:7 to enable one of the gates of select transistors. Other encodings and decodings can be used.

Select transistors 42, 44, . . . 56 are n-channel transistors in this example, but could be substituted with p-channel transistors or full transmission gates of p-channel and n-channel transistors. More complex tree logic could also be substituted to implement a multiplexer function so that one of the 8 taps is selected for the center tap.

The center tap of variable resistor 94 is selectable from among many points along its length. Traditional discrete variable resistors had a center tap that was movable, such as by a knob that turned a center-tap contact along a circular metal-plate resistor. For integrated circuit devices, such movable variable resistors are not practical, due in part to the tiny size of the devices. Instead, a variable resistor can be constructed using multiple resistors in series. The center tap is then selected by transistors.

Figure 5:
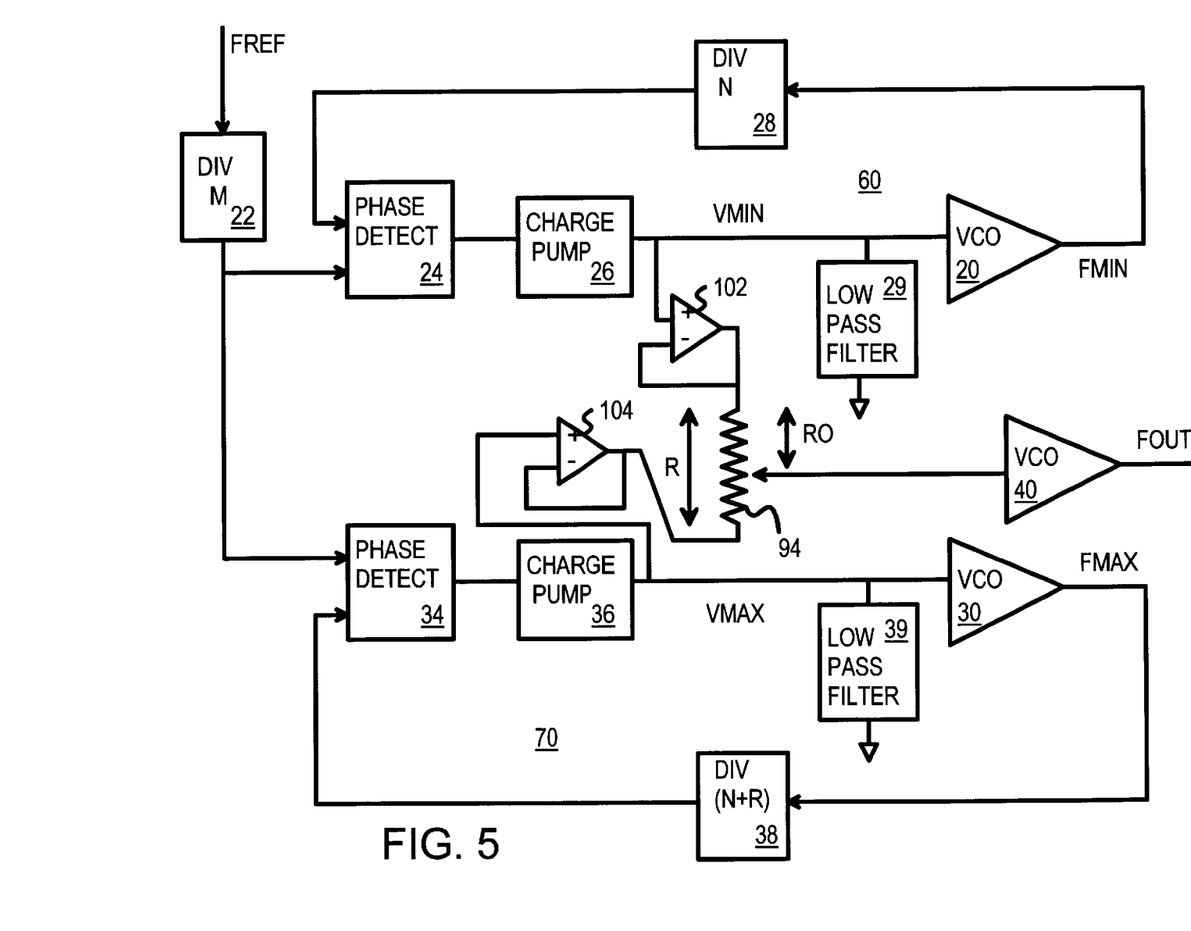
FIG. 5 is a diagram of a dual-PLL clock generator using op amps to isolate loops connected by a variable resistor.

Op Amps for Isolation—FIG. 5

FIG. 5 is a diagram of a dual-PLL clock generator using op amps to isolate loops connected by a variable resistor. Operation of loops 60, 70 is as described for FIG. 2.

A possible problem of current flow through variable resistor 94 from loop 60 to loop 70 is prevented by the addition of op amps 102, 104. VMIN from loop 60 is buffered by op amp 102, which drives the top of variable resistor 94. Likewise, op amp 104 buffers VMAX from loop 70, and drives the bottom terminal of variable resistor 94. Op amps 102, 104 have their inverting inputs connected to their outputs, and thus act as unity-gain buffers. Of course, other kinds of buffers could be substituted.

Advantages of the Invention

A finely-tuned output frequency is obtained without requiring any change to the reference frequency. A fixed reference frequency can be used. The dual-PLL circuit uses the fixed reference frequency input, but can generate a range of finely-tuned output frequencies. The variable resistor can be constructed from standard resistors and transistors that are easily integrated with the transistors in the PLL loops. A high level of integration is possible, allowing the dual-PLL clock generator to be integrated with other large-scale-integration systems such as microprocessors and complex communication chips. Of course, the advantages and benefits described may not apply to all embodiments of the invention.

ALTERNATE EMBODIMENTS

Several other embodiments are contemplated by the inventor. For example, the variable resistor can be implemented in a variety of ways. A traditional variable resistor has a center tap that is movable along the length of a resistive element, producing a resistance from one terminal to the center tap that varies with the distance to the movable center tap. Another way to implement a variable resistor that is easily integrated onto an integrated circuit (IC) is one that uses several resistors that are selected with transistor gates. The transistors connect different numbers of the resistors in a series to vary the total resistance. Parallel connection of some of the resistors can also be used to reduce total resistance. Control signal to the gates of the transistors can be input to the IC as a code that indicates the desired resistance. Complementary metal-oxide-semiconductor (CMOS) transistors can also be used to approximate the resistors. Long-channel transistors operated in the linear region can produce useful resistances, even if not completely linear.

Low pass filters 29, 39 can be simple R-C networks that smooth out clock variations over several loop periods. Other kinds of filters and variations can be used as well. The output VCO could have a different voltage-to-frequency function than the VCO's in the first and second PLL loops. The output frequency would still be selectable between two endpoint frequencies that are determined by the VCO input voltages as if they were input to loop VCO's having the same voltage-to-frequency function as the output VCO. The reference clock could be divided for input to one PLL loop, but not divided to the other PLL loop. While determining the output frequency is more complex, the principles of the invention can still be applied. The output frequency could also be determined empirically if necessary.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A dual-loop clock generator comprising:

a reference-clock input, having a reference frequency;

a first phase-locked loop, receiving the reference-clock input, for generating a first feedback clock having a first feedback frequency, the first phase-locked loop phase comparing the reference-clock input to the first feedback clock, the first phase-locked loop charging and discharging a first capacitance in response to phase comparison to adjust a first voltage;

a second phase-locked loop, receiving the reference-clock input, for generating a second feedback clock having a second feedback frequency, the second phase-locked loop phase comparing the reference-clock input to the second feedback clock, the second phase-locked loop charging and discharging a second capacitance in response to phase comparison to adjust a second voltage;

wherein the second voltage differs from the first voltage;

a variable resistor coupled between the first voltage and the second voltage, the variable resistor having a selectable center tap, wherein an output resistance from the first voltage to the selectable center tap is selectable among a range of fractional resistances of the variable resistor; and an output-clock generator, coupled to the variable resistor by selectable center tap, for generating an output clock having an output frequency, the output frequency determined by the selectable center tap, whereby the output frequency is determined by the selectable center tap of the variable resistor between the first and second phase-locked loops.

2. The dual-loop clock generator of claim 1 wherein the first phase-locked loop has a first voltage-controlled oscillator (VCO) that receives the first voltage, the first VCO generating a first clock having a first frequency;

wherein the second phase-locked loop has a second VCO that receives the second voltage, the second VCO generating a second clock having a second frequency;

whereby the first and second phase-locked loops use VCOs to generate clocks.

3. The dual-loop clock generator of claim 2 wherein the output frequency is selectable between the first frequency and the second frequency, whereby the output frequency is an intermediate frequency.

4. The dual-loop clock generator of claim 2 wherein the first phase-locked loop further has a first divider, coupled to an output of the first VCO, for dividing the first frequency to generate the first feedback clock;

wherein the second phase-locked loop further has a second divider, coupled to an output of the second VCO, for dividing the second frequency to generate the second feedback clock, whereby dividers generate feedback clocks.

5. The dual-loop clock generator of claim 4 wherein the second divider divides by a larger divisor than the first divider, whereby different feedback divisors are used by the first and second phase-locked loops.

6. The dual-loop clock generator of claim 2 wherein the output-clock generator is a third VCO that generates the output clock with the output frequency being a function of an output voltage, the output voltage being a voltage along the variable resistor selected by the selectable center tap, whereby the output clock is generated by the third VCO.

7. The dual-loop clock generator of claim 6 wherein the variable resistor further comprises:

a series of sub-resistors coupled in a series between the first and second voltages;

a multiplexer, coupled to nodes between the sub-resistors, for coupling one of the nodes to the selectable center tap as the output voltage, whereby the variable resistor multiplexed nodes to the selectable center tap.

8. The dual-loop clock generator of claim 7 wherein the sub-resistors each have a same fixed resistance, whereby a total resistance of the variable resistor is equally divided by the sub-resistors.

9. The dual-loop clock generator of claim 8 wherein the output frequency is selected as a linear function having endpoints determined by the first and second frequencies.

10. The dual-loop clock generator of claim 9 further comprising:

an input divider, receiving a primary-input clock, for dividing the primary-input clock to generate the reference-clock input having the reference frequency, whereby the primary-input clock is divided.

11. The dual-loop clock generator of claim 10 wherein the first phase-locked loop further comprises a first charge pump, responsive to phase comparison by the first phase-locked loop, for charging and discharging the first capacitance;

wherein the second phase-locked loop further comprises a second charge pump, responsive to phase comparison by the second phase-locked loop, for charging and discharging the second capacitance;

wherein the first capacitance is in a first low-pass filter that has a first resistance, and the second capacitance is in a second low-pass filter that has a second resistance.

12. The dual-loop clock generator of claim 11 wherein the variable resistor includes buffer means for preventing direct current flow between the first phase-locked loop and the second phase-locked loop.

13. A dual phase-locked loop (PLL) variable-frequency clock generator comprising:

a fixed-frequency clock input;

a first PLL, receiving the fixed-frequency clock input, for generating a first voltage on a first node, the first voltage determining a first frequency of the first PLL;

a second PLL, receiving the fixed-frequency clock input, for generating a second voltage on a second node, the second voltage determining a second frequency of the second PLL;

a connecting resistor, coupled between the first and second PLL, connected to the first node at a first terminal of the connecting resistor, and connected to the second node at a second terminal of the connecting resistor;

a final voltage-controlled oscillator (VCO), generating a final clock having a final frequency that is determined by a final voltage input to the final VCO; and a selector, coupled to the connecting resistor, for selecting the final voltage from voltages along the connecting resistor between the first voltage and the second voltage, whereby the final frequency is selectable by the selector that selects the final voltage along the connecting resistor between the first and second PLL's.

14. The dual PLL variable-frequency clock generator of claim 13 wherein the first PLL comprises:

a first phase comparator, receiving the fixed-frequency clock input and a first feedback clock, for comparing phases of the fixed-frequency clock and the first feedback clock;

a charge pump, responsive to the first phase comparator, for charging and discharging the first node in response to a phase difference between the fixed-frequency clock and the first feedback clock;

a first VCO, coupled to the first node, for generating a first clock having a first frequency determined by the first voltage;

a first feedback divider, receiving the first clock, for generating the first feedback clock;

wherein the second PLL comprises:

a second phase comparator, receiving the fixed-frequency clock input and a second feedback clock, for comparing phases of the fixed-frequency clock and the second feedback clock;

a charge pump, responsive to the second phase comparator, for charging and discharging the second node in response to a phase difference between the fixed-frequency clock and the second feedback clock;

a second VCO, coupled to the second node, for generating a second clock having a second frequency determined by the second voltage;

a second feedback divider, receiving the second clock, for generating the second feedback clock, whereby the first and second VCO determine frequencies of the first and second clocks.

15. The dual PLL variable-frequency clock generator of claim 14 wherein the first PLL further comprises a first low-pass filter, coupled to the first node, for filtering phase differences among several clock periods;

wherein the second PLL further comprises a second low-pass filter, coupled to the second node, for filtering phase differences among several clock periods, whereby low-pass filtering is performed.

16. The dual PLL variable-frequency clock generator of claim 15 wherein the first feedback divider divides the first clock by N, wherein N is a whole number, while the second feedback divider divides the second clock by N+R, wherein R is a whole number that is smaller than N, whereby the second PLL divides by a larger number than the first PLL, causing the first voltage to be less than the second voltage.

17. The dual PLL variable-frequency clock generator of claim 16 wherein the connecting resistor comprises a plurality of series resistors having nodes between series resistors, wherein the selector comprises a plurality of transistors, each transistor coupled to one of the nodes along the connecting resistor.

18. A variable-frequency clock generator comprising:

clock input means for receiving a reference clock having a reference frequency;

first loop means, receiving the reference clock, for locking a first feedback clock to the reference clock by adjusting a first voltage of a first node;

second loop means, receiving the reference clock, for locking a second feedback clock to the reference clock by adjusting a second voltage;

wherein the first and second voltage are not equal in voltage;

variable resistor means, having a plurality of taps, for connecting the first node to the second node, for generating a plurality of different voltages on the plurality of taps, the plurality of different voltages having a range of voltages between the first voltage and the second voltage;

select means, coupled to the variable resistor means, for selecting as an output voltage one of the plurality of different voltages on a selected tap in the plurality of taps; and output clock means, responsive to the select means, for generating an output clock having an output frequency that is determined by the output voltage selected by the select means, whereby the output frequency is selected by the select means.

19. The variable-frequency clock generator of claim 18 wherein the output clock means comprises voltage-controlled oscillator (VCO) means for converting the output voltage to the output clock having the output frequency being a predetermined function of the output voltage.

20. The variable-frequency clock generator of claim 19 wherein the first loop means comprises:

first phase compare means, receiving the reference clock and the first feedback clock, for comparing clock phases;

first charge means, responsive to a phase difference from the first phase compare means, for increasing and decreasing the first voltage;

first VCO means, responsive to the first voltage, for generating a first clock with a first frequency being a predetermined function of the first voltage;

first feedback divider means, receiving the first clock, for generating the first feedback clock;

wherein the second loop means comprises:

second phase compare means, receiving the reference clock and the second feedback clock, for comparing clock phases;

second charge means, responsive to a phase difference from the second phase compare means, for increasing and decreasing the second voltage;

second VCO means, responsive to the second voltage, for generating a second clock with a second frequency being a predetermined function of the second voltage;

second feedback divider means, receiving the second clock, for generating the second feedback clock;

wherein the first and second feedback divider means divide by different values.

* * * * *